(12) United States Patent
Nitta et al.

(10) Patent No.: US 8,299,812 B2
(45) Date of Patent: Oct. 30, 2012

(54) PROBE CARD

(75) Inventors: Mitsuru Nitta, Tokyo (JP); Osamu Arai, Tochigi (JP); Motoharu Kimura, Aomori (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 287 days.

(21) Appl. No.: 12/646,776

(22) Filed: Dec. 23, 2009

(65) Prior Publication Data

US 2010/0156449 A1 Jun. 24, 2010

(30) Foreign Application Priority Data

Dec. 24, 2008 (JP) ................................. 2008-327567

(51) Int. Cl.
*G01R 31/00* (2006.01)
(52) U.S. Cl. ......... 324/756.03; 324/750.11; 324/754.07; 324/762.01
(58) Field of Classification Search ............. 324/750.03, 324/756.03, 750.09, 750.11, 754.07, 762.01
See application file for complete search history.

(56) References Cited

U.S. PATENT DOCUMENTS

| 7,816,929 B2* | 10/2010 | Yamada ................... 324/754.07 |
| 2002/0180466 A1* | 12/2002 | Hiramatsu et al. ............. 324/719 |
| 2003/0015521 A1* | 1/2003 | Ito .................................. 219/544 |
| 2007/0268029 A1* | 11/2007 | McClanahan et al. ......... 324/754 |
| 2008/0116925 A1* | 5/2008 | Sunohara et al. ............. 324/761 |

FOREIGN PATENT DOCUMENTS

| JP | 04-359445 | 12/1992 |
| JP | 2002014047 | 1/2002 |
| JP | 2005201844 | 7/2005 |
| JP | 2007183194 | 7/2007 |
| JP | 2008145238 | 6/2008 |

* cited by examiner

*Primary Examiner* — Arleen M Vazquez
(74) *Attorney, Agent, or Firm* — Graybeal Jackson LLP (57) ABSTRACT

An embodiment of a probe card comprising: a probe base plate including a ceramic base plate and a plurality of conductive paths; and a plurality of contacts disposed on one face of the probe base plate and electrically connected to the conductive paths. The ceramic base plate may be provided with: a plurality of first layers having a heating element which generates heat by electric power and disposed at intervals in the thickness direction of the ceramic base plate; second layers each interposed between adjoining first layers; and a power supply path for supplying electric power for heating to the heating element.

17 Claims, 7 Drawing Sheets

PROBE CARD

PRIORITY CLAIM

The instant application claims priority to Japanese Patent Application No. 2008-327567, filed Dec. 24, 2008, which application is incorporated herein by reference in its entirety.

TECHNICAL FIELD

The subject matter relates to a probe card for use in an electrical test of an integrated circuit.

BACKGROUND

An uncut integrated circuit formed in a semiconductor wafer, an integrated circuit cut into chip-like sections, and an integrated circuit (i.e., a device under test) such as an integrated circuit cut into chip-like sections and packaged or molded are subjected to a test as to whether or not they provide performance as per specification.

A probe card used in such a test generally comprises a probe base plate having a plurality of signal paths, i.e., electrically-conductive paths, and a plurality of contacts arranged on one face of the probe base plate and electrically connected to the conductive paths.

As such a probe base plate, a wiring board made of glass epoxy resin, a ceramic base plate made of ceramic, a flexible multi-layer wiring board made of an electrically insulated resin such as polyimide resin, or a base plate for combined use with the flexible multi-layer wiring board disposed on the underside of the ceramic base plate may be used.

Recently, testing of an integrated circuit under high temperature is under way. In this case, an integrated circuit is heated to a predetermined temperature by a heating element provided in a stage where the integrated circuit is disposed, whereby a probe base plate where a contact is disposed is also heated upon receipt of the heat from the stage and the integrated circuit. As a result, the integrated circuit and the probe base plate are thermally expanded.

If, however, an amount of thermal expansion of the integrated circuit and that of the probe base plate are different, a relative physical relation between an electrode of the integrated circuit and a tip of the contact changes, resulting in some contact with their tips left unpressed against the electrode of the integrated circuit.

Thus, a test apparatus is proposed wherein a heating element disposed within a probe base plate is heated to heat the probe base plate, thereby adjusting the temperature of the probe base plate. This is shown generally in Japanese Patent Publication No. 4-359445.

However, in the test apparatus as described in Japanese Patent Publication No. 4-359445, which uses a probe card, though it is difficult to provide a heating element of large capacity in a probe base plate, only a single metal layer is provided as a heating element in the probe base plate. Thus, it takes a long time for the probe card, particularly a ceramic base plate, to be heated to a predetermined temperature, and operating efficiency is low.

For instance, in a test apparatus to move a stage relative to the probe card every time a test of wafer is finished, the probe card is exposed to ambient temperature whenever the stage is separated from the probe card, and the temperature of the probe card lowers.

In an apparatus to test multiple wafers by dividing them into lots for testing per lot, each lot including a plurality of wafers, a probe card is exposed to ambient temperature not only each time a test of one wafer is finished, but also every time a stage is moved to replace the wafers per lot. In such an apparatus, the temperature of the probe base plate lowers while the probe card is exposed to ambient temperature.

In view of the above, in a test apparatus, the temperature of a probe card should be raised again to a predetermined temperature for the subsequent wafer test. In the conventional test apparatus, however, it takes a long time to raise the lowered temperature of the probe card again to a predetermined temperature, resulting in low test efficiency.

SUMMARY

A probe card is provided which may raise the temperature of a probe base plate to a predetermined temperature in a short time.

A probe card according to an embodiment of the present invention comprises a probe base plate having a ceramic base plate and a plurality of conductive paths, and a plurality of contacts arranged on one face of the probe base plate at intervals in the thickness direction of the ceramic base plate and electrically connected to the conductive paths. The ceramic base plate may have a plurality of first layers with a heating element which produces heat by electric power, a second layer disposed between adjoining first layers and having the conductive paths, and a power supply path for supplying electric power for heating to the heating element.

The heating element may include a concentric circle-like or a spiral-like pattern. The pattern of the first layers mutually adjacent in the thickness direction may be angularly displaced about the central axis of the concentric circle or the spiral.

The pattern of each first layer may be divided into plural sections or may be divided into plural pattern sections situated about the central axis of the concentric circle or the spiral, and further, may be divided into plural pattern sections in the radial direction of the concentric circle or the spiral.

The patterns of the first layers mutually adjacent in the thickness direction may be displaced from each other about the central axis of the concentric circle or the spiral at an angle which equals to the quotient of 360° divided by the number of the first layers.

The power supply path may penetrate the first and second layers in the thickness direction without contacting the conductive path and be connected to the heating element. In addition, the ceramic base plate may have a structure with the first and second layers laminated.

The ceramic base plate may include a plurality of the second layers situated in the thickness direction, and the second layers mutually adjacent in the thickness direction may be connected to each other without contacting the heating element.

The ceramic base plate may be provided with four first layers and a plurality of the second layers disposed between the first layers mutually adjacent in the thickness direction.

Delivery of test signals to the contacts may be made by using the conductive paths, and supply of the power for heating to the heating element may be made by using the power supply path. The probe base plate is heated when each heating element provided in the ceramic base plate generates heat, so that the temperature is raised.

In certain embodiments, since a multi-layer ceramic base plate may be used with the second layer having the conductive paths interposed between the first layers having the heater as at least part of the probe base plate, it is possible to use a heating element capable of generating a large amount of heat without causing thermal damage to the probe base plate, thereby improving a test efficiency.

DETAILED DESCRIPTION

Figure 1:
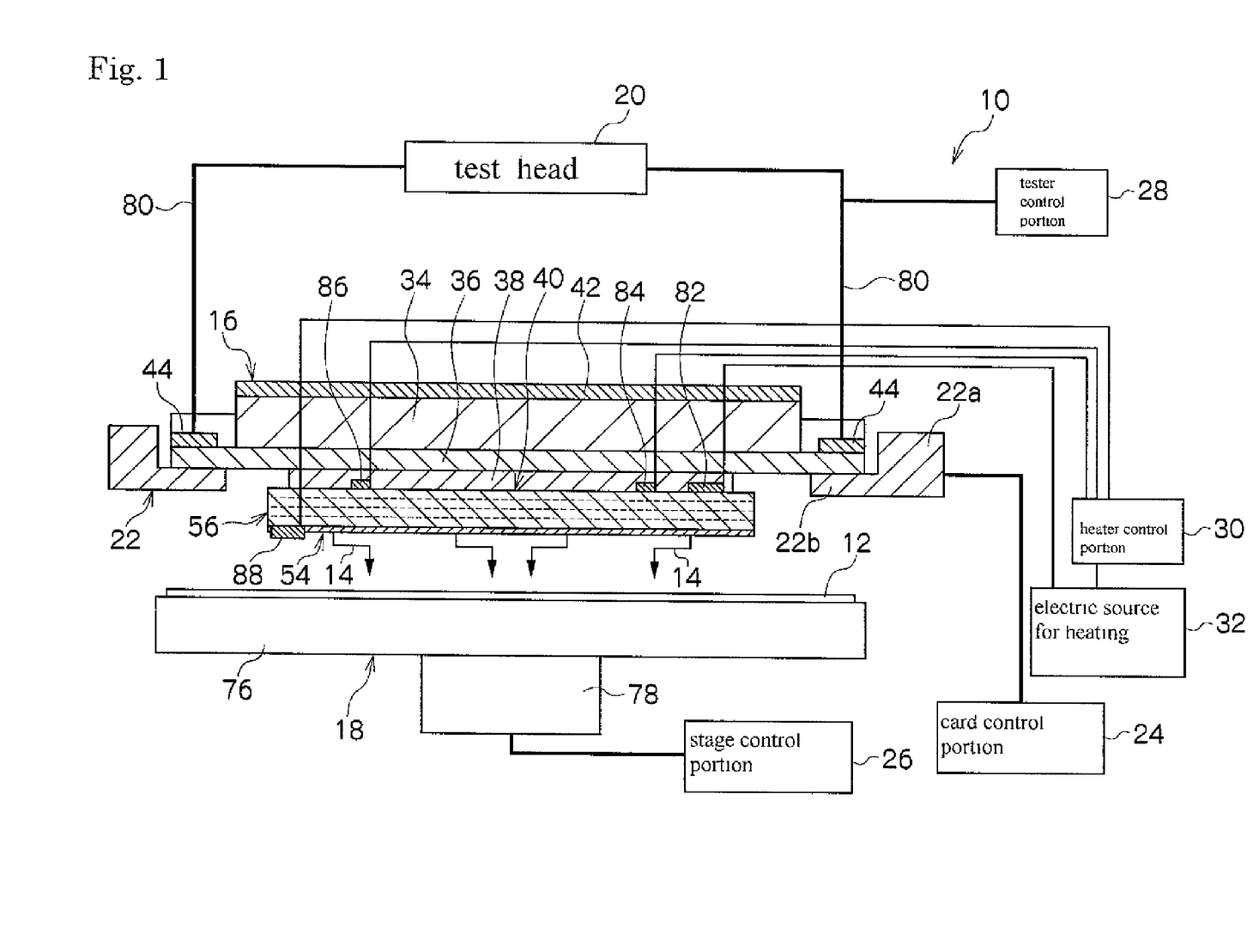
FIG. 1 is a diagram showing one embodiment of a test apparatus using a probe card.

In FIG. 1, the up-down direction is called vertical direction, the right-left direction is called lateral direction, and the front-back direction is called longitudinal direction. However, these directions are different according to the attitude of the probe base plate where multiple contacts are disposed and a state of the probe card attached to the test apparatus.

Therefore, the probe card herein may be used in a state of being attached to the test apparatus, whether the up-down direction may be actually the vertical direction, upside-down, diagonal direction or otherwise.

Referring to FIG. 1, a test apparatus 10 tests or examines a plurality of integrated circuits formed in a wafer 12, with a circular plate-like semi-conductive wafer 12 as a device under test, at one time or in plural times Each integrated circuit may have a plurality of electrodes (not shown) such as pad electrodes on the upper surface.

Figure 2:
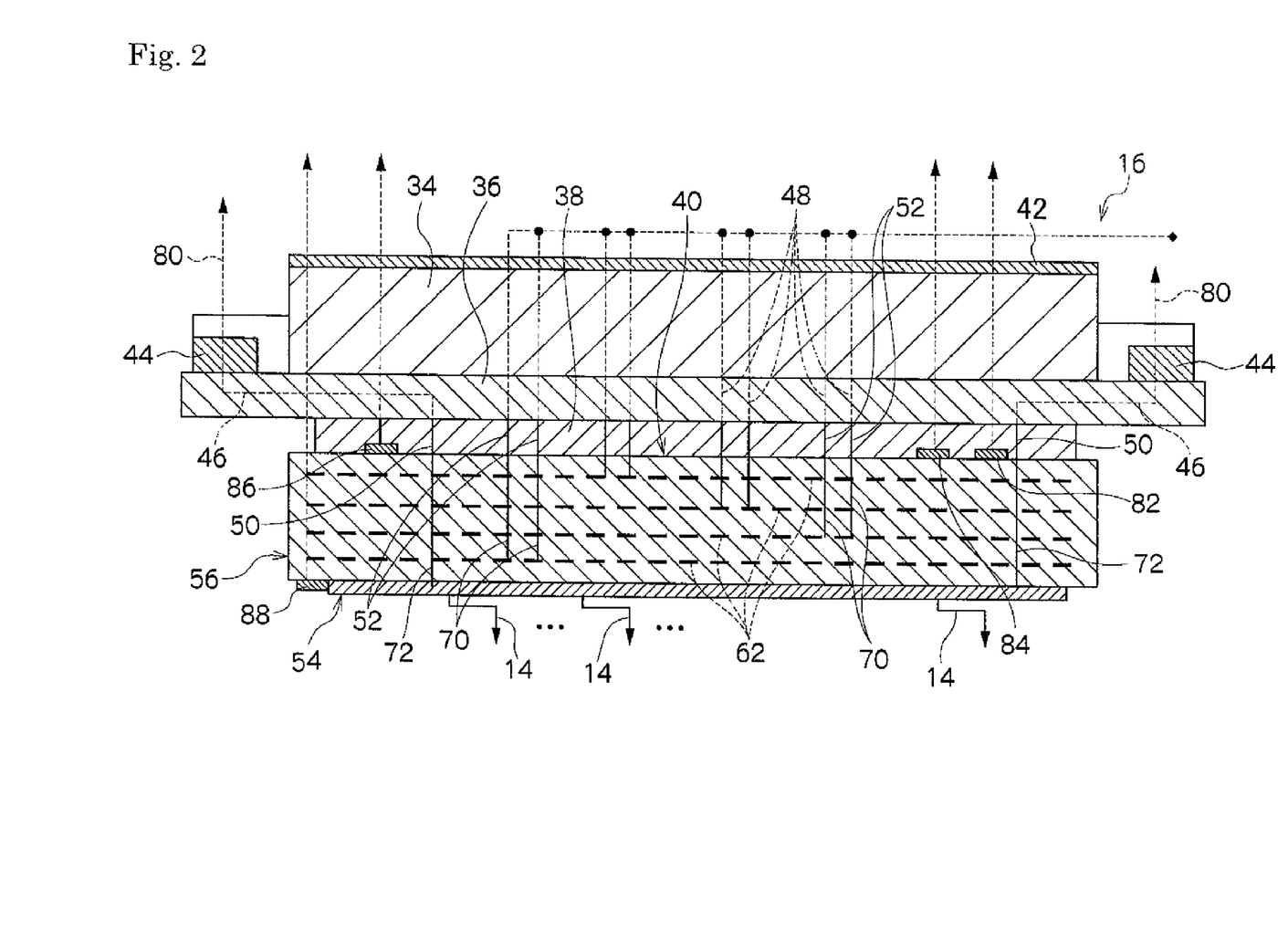
FIG. 2 is a sectional view showing one embodiment of the probe card used in the test apparatus shown in FIG. 1.

Referring to FIGS. 1 and 2, the test apparatus comprises: an electrical connecting apparatus, i.e., probe card 16, provided with a plurality of plate-like contacts 14; an inspection stage 18 on which the wafer 12 is disposed; a test head 20 electrically connected to the probe card 16; a card holder 22 for receiving the probe card 16 at its outer rim portion; a card control portion 24 for controlling the height or inclination of the card holder 22 relative to the inspection stage 18; a stage control portion 26 for controlling the position of the inspection stage 18 relative to the card holder 22; a tester control portion 28 for controlling the test head 20 to give and receive test signals to the contacts 14 (i.e., feed signals to be fed to the integrated circuits for testing and electrical signals such as answer signals to the feed signals from the integrated circuits); a heater control portion 30 for controlling temperature of the probe card 16; and an electric source for heating 32 for feeding electric power for heating (heating current).

As shown in FIG. 1, each contact 14 may use a crank-shaped plate-like probe. For example, a contact 14 as described in Japanese Patent Publication No. 2005-201844, may be used.

Each contact 14 may be, however, a heretofore publicly known one such as a probe made of a thin metallic wire such as tungsten line, a plate-like probe made by using photolithography technology and deposition technology, a probe with a plurality of wirings formed on one face of an electrically insulated sheet such as polyimide and with part of the wirings used as a contact, and the like.

The probe card 16 includes: a reinforcing member 34 having a flat underside; a circular flat plate-like wiring board 36 held on the underside of the reinforcing member 34; a flat plate-like electrical connector 38 disposed on the underside of the wiring board 36; a probe base plate 40 disposed on the underside of the electrical connector 38; a probe base plate 40 disposed on the underside of the electrical connector 38; and a circular cover 42 disposed on the reinforcing member 34. These members, 34 through 42, may be assembled separably and firmly with a plurality of bolts.

The reinforcing member 34 may be made of a metal material such as a stainless plate. For instance, as described in Japanese Patent Publication No. 2008-145238, the reinforcing member 34 may have an inner annular portion, an outer annular portion, a plurality of connections for combining both annular portions, a plurality of extensions extended radially outward from the outer annular portion, and a central frame portion integrally continuing to the inside of the inner annular portion, and may be configured so that a gap between those portions may act as a space opening both upward and downward.

Also, as described, for example, in Japanese Patent Publication No. 2008-145238, it is possible to dispose an annular thermal deformation control member for controlling thermal deformation of the reinforcing member 34 on the upside of the reinforcing member 34 and to dispose the cover 42 on the thermal deformation control member.

The wiring board 36 may be, by way of illustration, made of an electrically insulating resin such as glass-containing epoxy resin to be shaped like a disk, having a plurality of conductive paths or internal wirings 46 to be used for delivery of test signals to the contacts 14, and a plurality of power supply paths 48 to be used for supplying electric power for heating.

In an annular rim portion of the upside of the wiring board 36 there may be multiple connectors 44 to be connected to the test head 20. Each connector 44 may have a plurality of terminals (not shown) electrically connected to the internal wirings 46.

The reinforcing members 34 and the wiring board 36 may be coaxially combined by a plurality of screw members (not shown) with the underside of the reinforcing member 34 and the upside of the wiring board 36 in contact with each other.

The electrical connector 38 may be one as described in, for example, Japanese Patent Publication No. 2008-145238. The electrical connector 38 may be provided with publicly-known plural connecting pins 50, 52 such as pogo pins (each of which may have an upper pin member and a lower pin member extending, respectively, upward and downward with a spring in an electrically insulating pin holder therebetween). The internal wirings 46 of the wiring board 36 and the power supply paths 48 are electrically connected to conductive paths 72 and power supply paths 70, which will be explained later, of the probe base plate 40, respectively, by means of the connecting pins 50 and 52.

The electrical connector 38 may be combined with the underside of the wiring board 36 at the pin holder by a plurality of screw members and suitable members (neither are shown) such that the upsides of the pin holders are abutted on the underside of the wiring board 36.

Further, each of the connecting pins 50 and 52 may have the upper pin member and lower pin member with a spring therebetween. The upper pin member may be pressed against a terminal portion (not shown) continuous to the lower end of the internal wiring 46 of the wiring board 36 or the power supply path 48, while the lower pin member may be pressed against another terminal portion provided on the upside of the probe base plate 40.

The probe base plate 40 may be, by way of illustration, a base plate for combined use having a flexible multi-layer sheet 54 made of an electrically insulating resin such as polyimide resin on the underside of a multi-layer ceramic base plate 56 and the contacts 14 cantilevered on the underside of the multi-layer sheet 54.

The multi-layer sheet 54 may have various configurations, including a plurality of internal wirings (not shown) inside and a plurality of probe lands (not shown) electrically connected to the internal wirings and may be formed integrally with the ceramic base plate 56.

Each contact 14 may be cantilevered on the probe land with its front end (tip) projected downward by an electrically conducting bond such as soldering, welding by laser, and the like.

Figure 3:
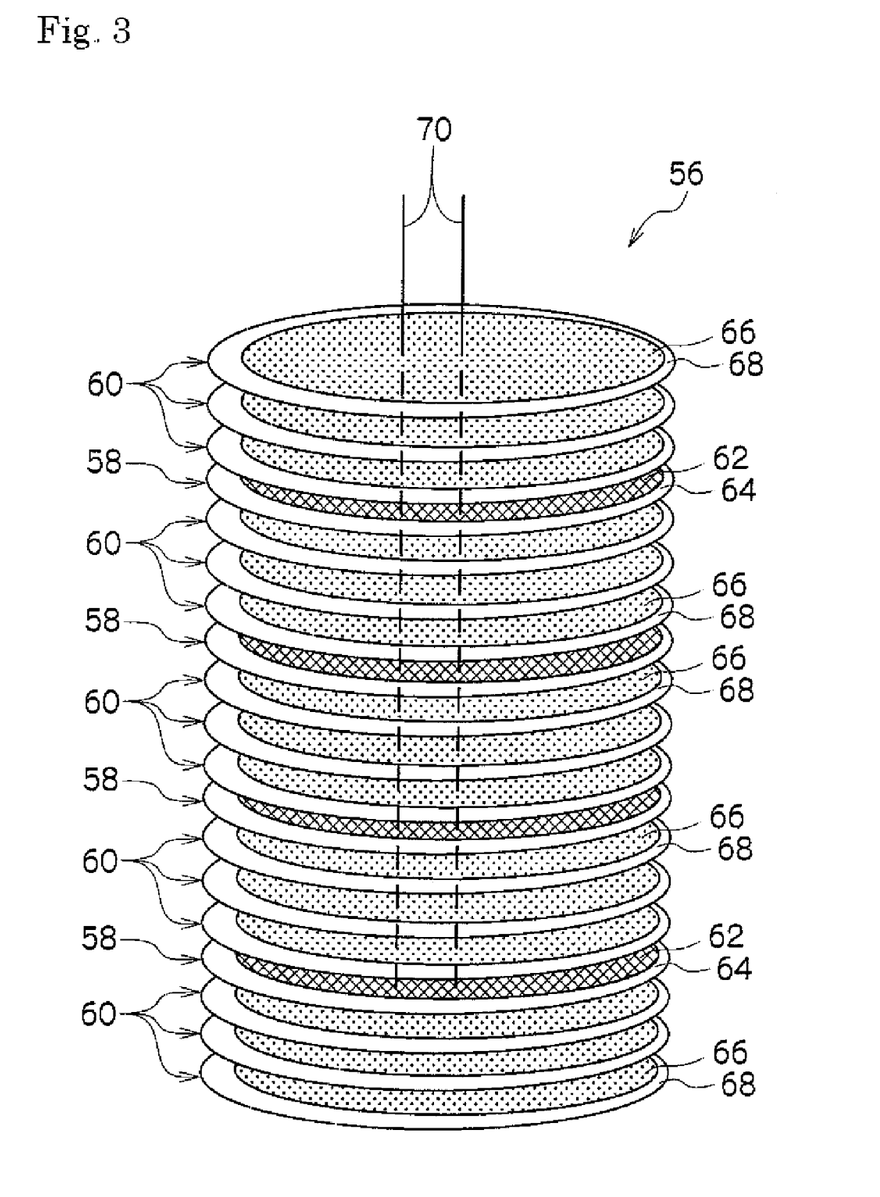
FIG. 3 is an exploded perspective view showing one embodiment of a ceramic base plate used in the probe card shown in FIG. 2.

As shown in FIG. 3, the ceramic base plate 56 may have a plurality of heat generating layers 58 and a plurality of conductive layers 60. In the example of FIG. 3, there are provided a plurality of (four) heat generating layers 58 at intervals in the thickness direction (in the illustration, vertical direction), and a plurality of (three) conductive layers 60, respectively, between adjacent heat generating layers 58, as well as plural layers (three), respectively, on the upside of the uppermost heat generating layer 58 and on the underside of the lowest heat generating layer 58.

Figure 5:
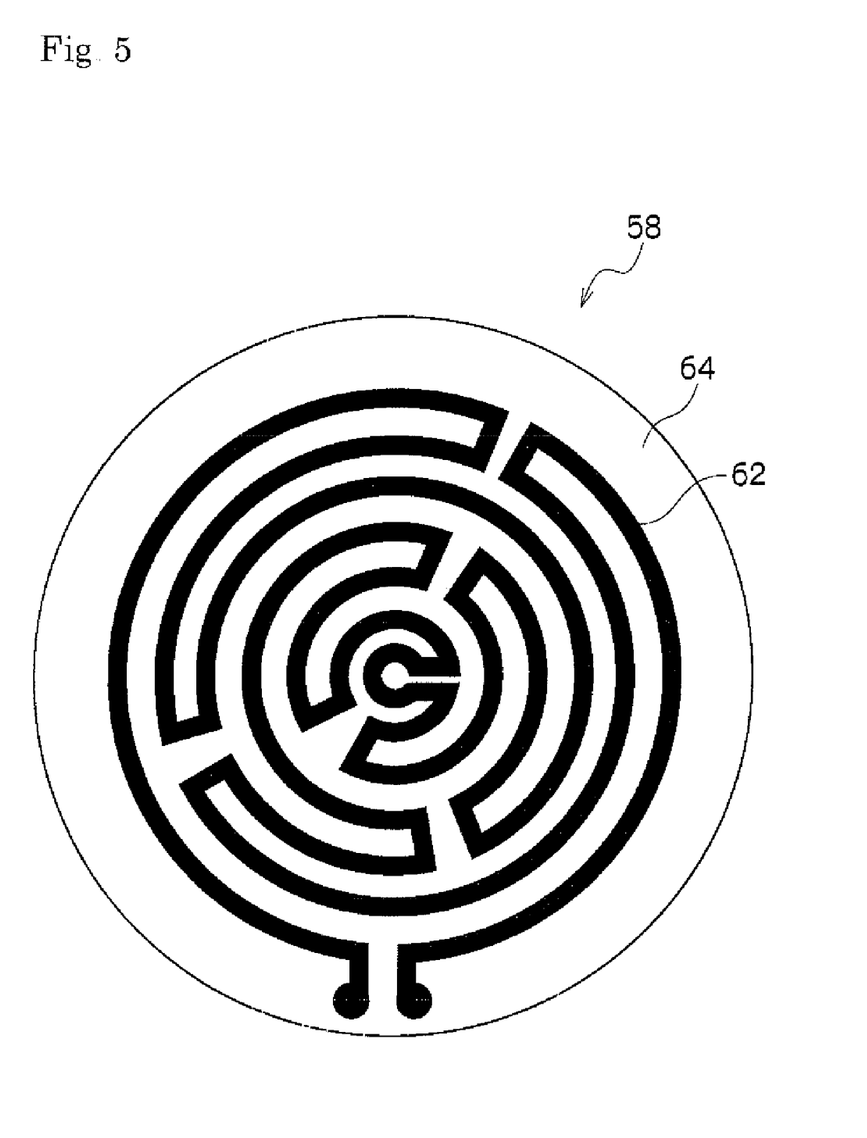
FIG. 5 is a plan view showing one embodiment of a pattern for heating.

Each heat generating layer 58 may have a heating element 62 formed on one face of a thin ceramic layer 64. The heating element 62 of each heat generating layer 58 may have, as shown in FIG. 5 for example, a pattern formed like a unicursal and a concentric circle.

In contrast to this, each conductive layer 60 may have wiring 66 like a wiring pattern on one face of a thin ceramic layer 68. Each wiring 66 of the ceramic base plate 56 may be electrically connected to internal wiring of the multi-layer sheet 54 and used for delivery of a test signal to the contact 14 together with the internal wiring.

Each heating element 62 may be electrically connected to a pair of power supply paths 70 which extend through the heat generating layers 58 and conductive layers 60 in the thickness direction. The heating element 62 may be connected to a pair of power supply paths provided at each heating element or may be connected in parallel to the pair of power supply paths 70 common to the plural heating elements 62.

Each wiring 66 may be electrically connected to a conductive path 72 extending through the heat generating layers 58 and conductive layers 60 in the thickness direction. The power supply paths 70 and conductive paths 72 may be respectively formed by a combination of conductive via holes formed in the heat generating layers 58 and conductive layers 60.

Figure 4:
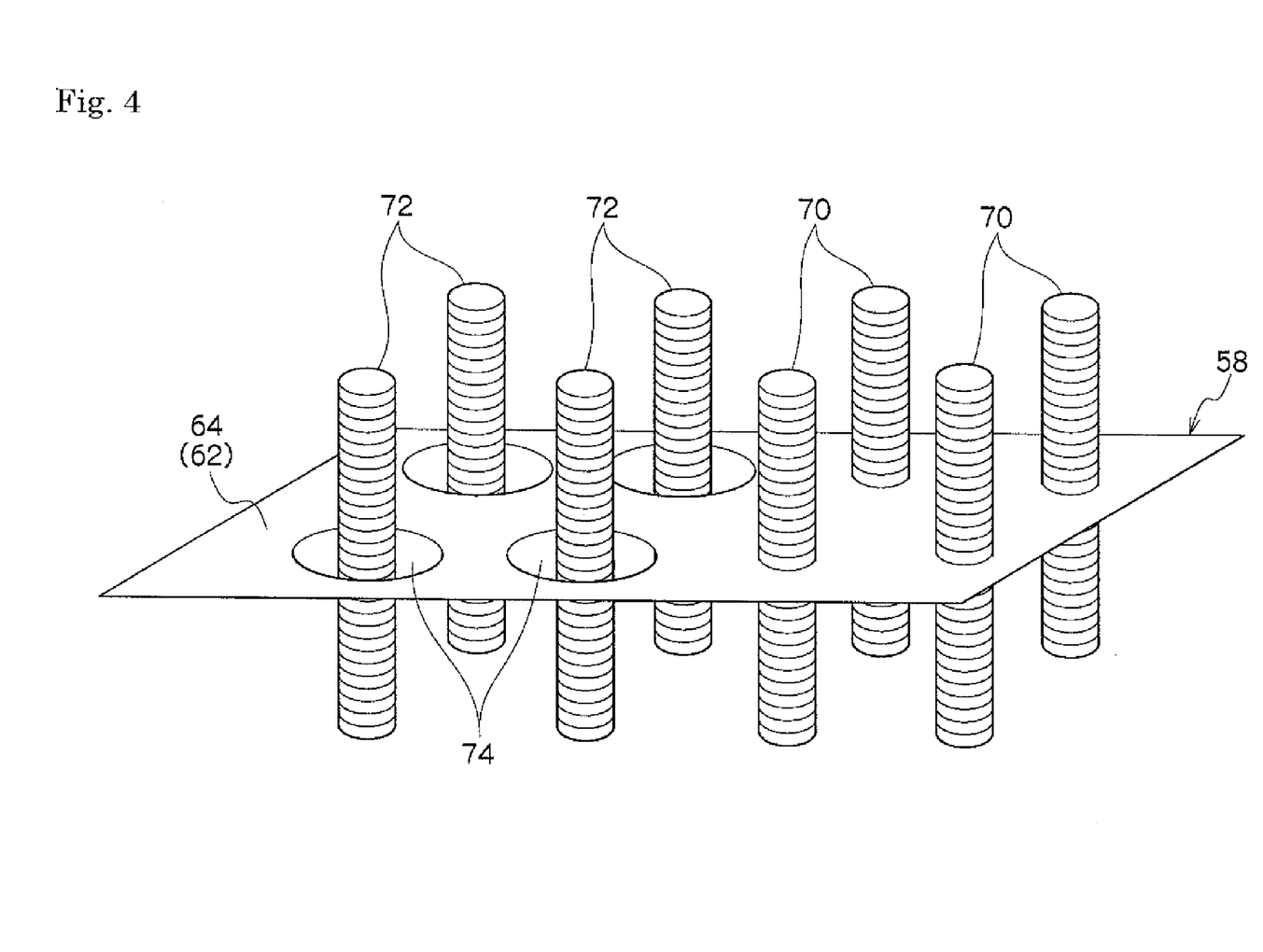
FIG. 4 is a perspective view for explaining the relation between a heat generating layer, a power supply path and wiring in the ceramic base plate shown in the embodiment of FIG. 3.

Each conductive path 72 may be electrically connected to the wiring 66 of the corresponding conductive layer 60 but may not be electrically connected to the power supply path 70 of the conductive layer. Consequently, as shown in FIG. 4, each heat generating layer 58 may be provided with a through hole which allows the conductive path 72 to penetrate without contacting the heating element 62, and an electrically insulating area 74 such as a without-pattern area where no heating element 62 exists.

On the contrary, while each power supply path 70 may be electrically connected to the heating element 62 of the corresponding heat generating layer 58, it is not necessarily electrically connected to the wiring 66 of the conductive layer 60. Therefore, each conductive layer 60 may be provided with a through hole which allows the power supply path 70 to penetrate without contacting the wiring 66, and another electrically insulating area (not shown) such as a wiring non-existing area with no wiring 66.

An electrically insulating layer and the conductive layer 60 may be interchanged. In such a case, it is possible to provide a plurality of insulating layers or a single insulating layer between the heat generating layers 58 adjacent to each other in the thickness direction, and on each of the upside of the uppermost heat generating layer 58 and the underside of the lowest heat generating layer 58. The above-mentioned electrically insulating areas, respectively, provided between the heat generating layers 58 adjacent to each other in the thickness direction, on the upside of the uppermost heating layer 58 and on the underside of the lowest heat generating layer 58 are not necessarily through holes.

However, the conductive paths 72 of the insulating layers adjoining in the thickness direction are connected to each other without contacting the heating element 62 of the heat generating layer 58. Consequently, each heat generating layer 58 may have the areas 74 without pattern. Thus, in some embodiments, a test signal passing through the conductive path 72 is not affected by the electric power for heating which passes the power supply path 70.

The probe base plate 40 such as mentioned above may be combined with the underside of the wiring base plate 36 by a plurality of screw members and suitable members (neither is shown) such that the upside of the ceramic base plate 56 is pressed against the underside of the electric connector 38. Thus, the lower ends of the connection pins 50 and 52 are respectively pressed against the upper ends of the power supply path 70 and conductive path 72 to be electrically connected to the power supply path 70 and conductive path 72.

Referring again to FIGS. 1 and 2, the card holder 22 may be made of an electrically insulating material and may have a ring-like rim portion 22a such as an inward flange and an upward stage portion 22b extending inward from the lower end portion of the rim portion 22a. The stage portion 22b may be shaped like a ring, such as an inward flange, and may receive the underside of the outer rim portion of the wiring board 36.

The probe card 16 may be attached to the stage portion 22b of the card holder 22 by a plurality of screw portions (not shown) in the extended portion 34d of the reinforcing member 34 such that the outer rim portion of the wiring board 36 is received by the stage portion 22b and that the probe card 16 is situated under the housing of the test head 20.

The card holder 22 may be attached to the frame or the housing of the test apparatus 10 through a card support mechanism (not shown) which changes inclination of the card holder 22 relative to the inspection stage 18.

The above-mentioned card support mechanism, controlled by the card control portion 24 prior to a test, in particular, prior to a test of one lot or one wafer, changes the height or inclination of the card holder 22, eventually, of the probe card 16, relative to the inspection stage 18. Thus, the probe card 16 may be positioned at a predetermined height position relative to the wafer 12 where an imaginary tip plane formed by the tips of the contacts 14 is received in a chuck top 76.

A card support mechanism such as above is described, for example, in Japanese Patent Publication Nos. 2002-14047 and 2007-183194.

The inspection stage 18 may have a stage, that is, the chuck top 76, for releasably adsorbing the wafer 12 vacuum-wise, and a chuck top moving mechanism 78 for moving the chuck top 76 three-dimensionally in the longitudinal, lateral and vertical directions relative to the probe card 16 as well as for angularly rotating about a θ-axis extending in the vertical direction.

The inspection stage 18 is moved longitudinally and laterally relative to the probe card 16 by a stage moving mechanism (not shown). Thus, the inspection stage 18 is prevented from moving longitudinally and laterally during the test of the wafer 12, but may be moved longitudinally and laterally by the stage moving mechanism for replacing the wafer for one lot to be tested.

In addition, the inspection stage 18 may be moved longitudinally and laterally by the moving mechanism for replacement of the wafer to be tested during the test of the wafer of one lot. It is, however, possible to replace the wafer to be tested without moving the inspection stage 18 during the test of the wafer 12 of one lot.

Instead of providing such a stage moving mechanism as described above, a function of the chuck top moving mechanism 78 to move the chuck top 76 longitudinally and laterally may be used.

Prior to the test of the wafer 12, the chuck top moving mechanism 78, controlled by the stage control portion 26, moves the inspection stage 18 three-dimensionally and angularly rotates it about the θ-axis. Thus, the wafer 12 received by the chuck top 76 may be positioned such that an electrode of an integrated circuit provided therein is opposed to the tip of the contact 14.

When replacing the wafer to be tested, the inspection stage 18, before being moved longitudinally and laterally by the above-mentioned stage moving mechanism, may be maintained in a state that the chuck top 76 is lowered by the chuck top moving mechanism 78 to a position where the wafer 12 is not brought into contact with the contact 14.

The test head 20 may include a plurality of circuit boards where completed integrated circuits are placed on a support base plate like a wiring board and a box for accommodating these circuit boards, and may be disposed above the probe card 16.

In the illustration, the integrated circuit of each circuit board is electrically connected to the internal wiring 46 of the wiring board 36 through wiring 80 and the connector 44. Thus, the integrated circuit of each circuit board, controlled by the tester control portion 28 at the time of an actual test, delivers test signals to the integrated circuit of the wafer 12 through the probe card 16.

The electric source for heating 32 supplies heating power to the power supply path 70 through a thermal fuse 82 provided in the ceramic base plate 56. Though not shown, the thermal fuse 82 may be disposed in a supply path of current for heating from the electric source for heating 32 to the power supply path 70.

The thermal fuse 82 comes down and breaks an electric line for source for heating between the electric source for heating 32 and the power supply path 70 like a general electrical fuse when a temperature of the ceramic base plate 56 exceeds a tolerance. Thus, the safety of the probe card 16 is maintained.

The source for heating 32 may be one exclusively used for the probe card 16. Thus, the above-mentioned test apparatus 10, in particular, the probe card 16 may be easily applied to an existing test apparatus. However, a circuit other than one exclusively used for the probe card 16 such as the power circuit of the tester may be used as an electric source for heating.

The probe card 16 also comprises the probe base plate 40, in particular, a temperature sensor 84 and an overheat protecting member 86, respectively, disposed on the upside of the ceramic base plate 56, and a stage sensor 88 provided on the probe base plate 40, in particular, on the underside of the multi-layer sheet 54. These sensors 84, 88 and the member 86 are connected to the heater control portion 30.

The temperature sensor 84 detects the temperature of the probe card 16, in particular, of the probe base plate 56 and supplies an electrical signal corresponding to the temperature of the probe base plate 56 to the heater control portion 30. The heater control portion 30 controls the electric source for heating 32 so as to output a predetermined electric power for heating on the basis of a signal from the temperature sensor 84.

The overheat protecting member 86 may be a circuit-breaking member such as IC relay, semiconductor relay, transistor or the like. The heater control portion 30 determines whether the temperature of the probe base plate 56 is over a tolerance on the basis of the signal from the temperature sensor 84 and, if over, actuates the overheat protecting member 86 to break the feeding path for the heating power.

As the overheat protecting member 86, a circuit-breaking member such as bimetal may be used instead of using such a circuit-breaking member as mentioned above. In such a case, when the temperature of the probe base plate 56 exceeds the tolerance determined by the circuit-breaking member, the circuit-breaking member itself opens circuit and breaks the feeding path of the heating power. Opening circuit of the circuit-breaking member at this time may be confirmed at the heating control portion 30.

Whichever type of the above-mentioned overheat protection member 86 may be used, the safety of the probe card 16 may be maintained. Thus, the safety of the probe card 16 may be doubled, combined by opening circuit of the temperature fuse 82 when the temperature of the probe base plate 56 exceeds the tolerance and breaks the feeding path of the heating power.

The heater control portion 30, particularly when the temperature of the probe base plate 6 is over the tolerance, outputs a signal to have the power source for heating 32 break feeding of the heating power. Such a function of the heater control portion 30 further enhances the safety of the probe card 16.

The stage sensor 88 generates an electrical signal to be used in determining whether or not the chuck top 76, in particular, is situated in the vicinity of (particularly, under) the probe base plate 40 and outputs the electrical signal to the heater control portion 30. As the stage sensor 88, a capacitive sensor which detects an electrical capacitance between the probe base plate 40 and the chuck top 76 may be used.

In the test apparatus 10 and probe card 16 such as above, since the conductive path 72 may be electrically separated from the heat generating layer 58 by the area 74 without pattern, the power for heating to be fed to the heating element 62 does not affect the conductive path 72, eventually, the wiring 66.

The heating element 62 of each heat generating layer 58 generates heat at each part in the radial direction when fed the heating power. Since the probe card 16 may have a plurality of heat generating layers 58, each heat generating layer 58 may be provided with a heating element having a configuration, like the unicursal and concentric circle heating element 62, capable of generating a large amount of heat, eventually, to heat the probe base plate 40 at each part in the radial and vertical directions simultaneously to be able to raise the temperature to a predetermined value in a short time.

As a result, the probe base plate 40 may be heated in a short time to a temperature which makes the amount of its thermal expansion equal to that of the integrated circuits on the wafer 12 in a short time, thereby remarkably improving a test efficiency.

It is possible to pass electric current through the heating element 62 at an arbitrary period while no test is conducted such as when the inspection stage 18 does not exist under the probe card 16, when the inspection stage 18 is moved to be under the probe card 16, when no electrical signal for testing is fed to the wafer 12, and so forth, or while no electrical signal for testing is fed to the wafer 12.

As mentioned above, in embodiments where the ceramic base plate 56 has a plurality of heat generating layers 58, a larger amount of heat may be generated than when it has a single heat generating layer. Also, if each heat generating layer 58 has a configuration of a unicursal or a concentric circle, a large amount of heat may be generated, although heat is generated equally and efficiently at each part in the radial direction of each heat generating layer 58, in comparison with a disk-shaped heating element.

In some embodiments, an advantage of enabling heating of the probe base plate 56 to a predetermined temperature in a short time such as above is effective particularly in case the temperature of the probe base plate 56 is lower than a predetermined temperature.

For instance, unless the inspection stage 18 exists under the probe card 16, the temperature of the probe base plate 56 gets lower than the predetermined temperature while the inspection stage 18 is moved to be under the probe card 16.

In such a case, a test of the integrated circuits on the wafer 12 should be suspended until the thermal expansion amount of the probe base plate 40 becomes approximately the same as the thermal expansion amount of the integrated circuits. This period of suspension of the test greatly affects the test efficiency.

According to the inspection stage 18 and probe card 16, however, as mentioned already, the probe base plate 40 may be heated in a short time to enable the thermal expansion amount of the probe base plate 40 to be equal to the thermal expansion amount of the integrated circuits on the wafer 12 in a short time, thereby shortening a test suspension period.

In various embodiments, instead of using the heating element 62 having a pattern configuration formed like a unicursal and a concentric circle, a heating element having a spiral pattern may be used.

Figure 6:
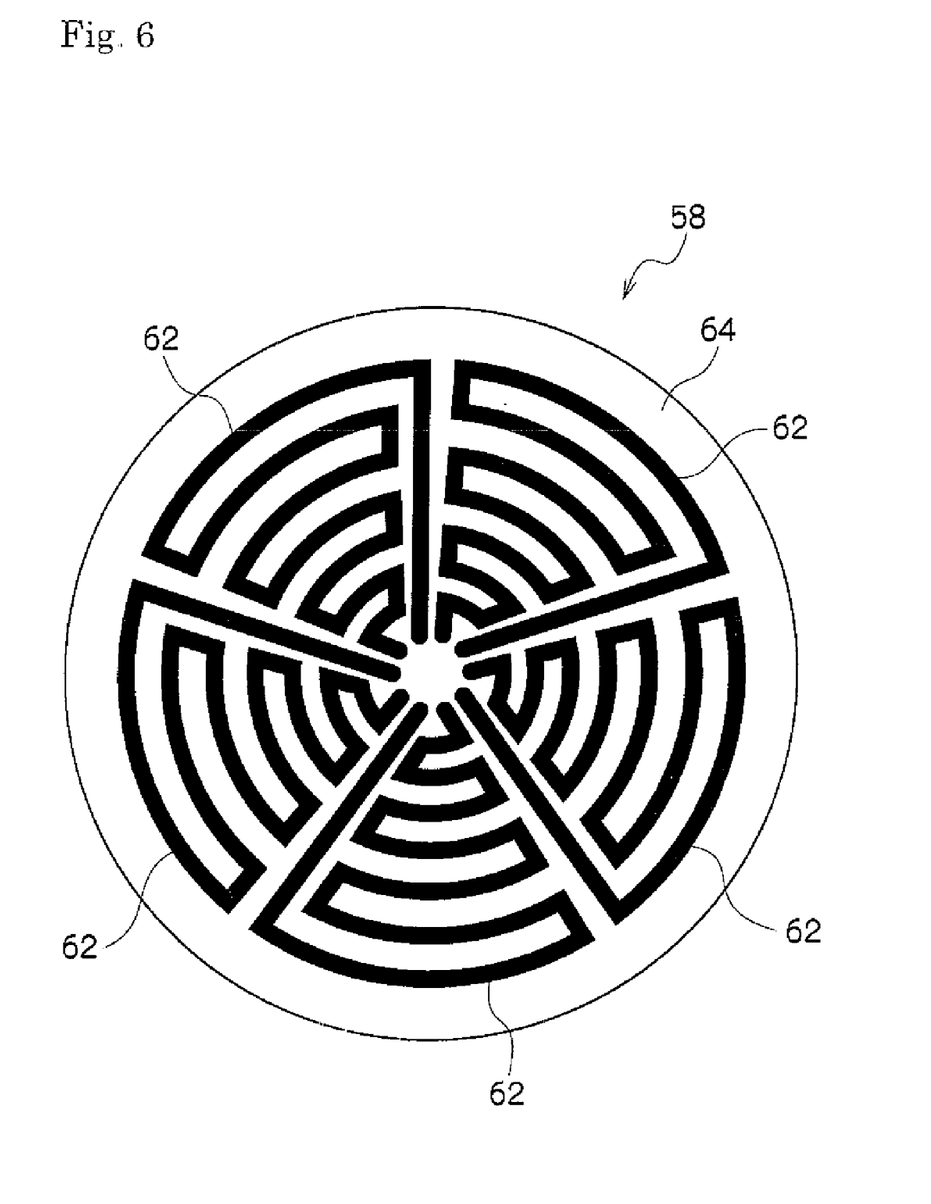
FIG. 6 is a plan view showing another embodiment of a pattern for heating.
Figure 7:
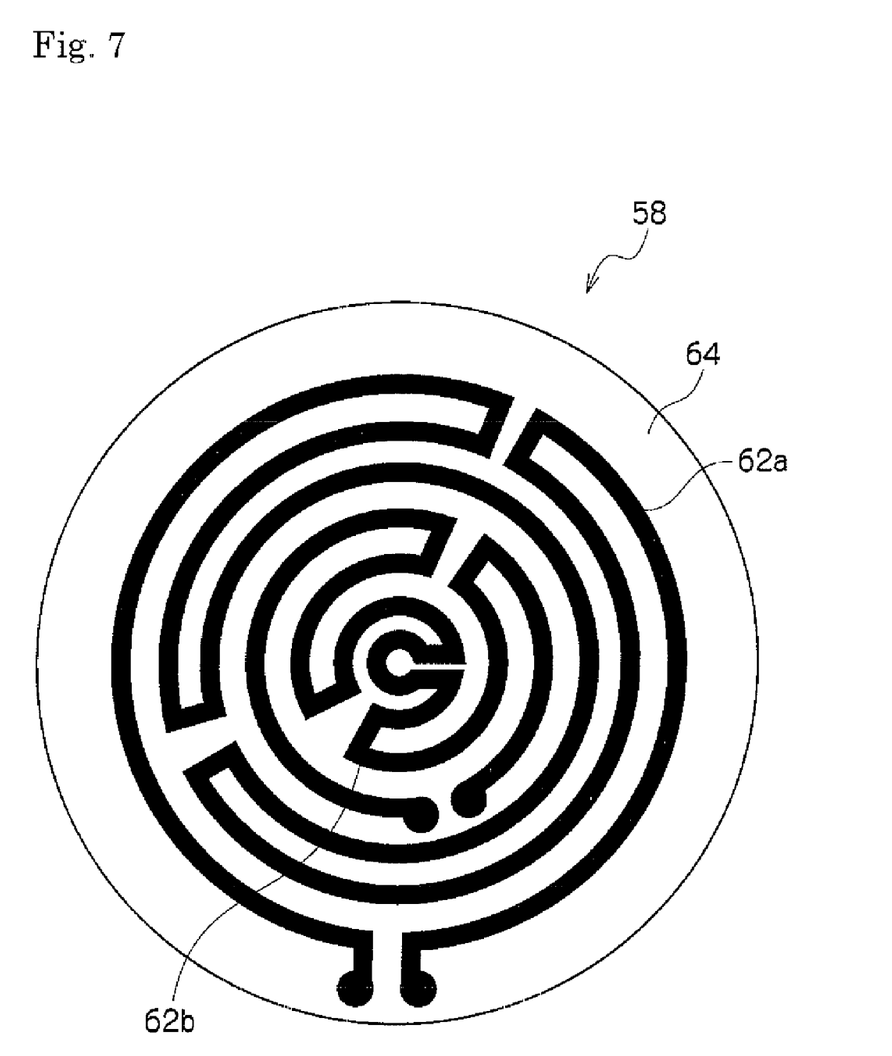
FIG. 7 is a plan view showing a further embodiment of a pattern for heating.

Also, as shown in FIG. 6, it is possible to use a heating element 62 having a pattern form divided into plural pattern sections situated around the central axis of a concentric circle (or spiral form), or to use a heating element 62 having a pattern form divided into plural pattern sections 62a, 62b situated in the radial direction of the concentric circle (or spiral form), as shown in FIG. 7.

As shown above, by using the heating element 62 which has the pattern form divided into plural pattern sections in the radial direction of the concentric circle or the spiral form, it is possible to realize a pattern configuration of the heat generating layer 58 which generates the more heat at portions where the more quantity of heat is dissipated around. As such a pattern configuration, there is a form to make the heat generation amount per unit area smaller toward the central portion by varying a width dimension and/or pitch of a pattern.

Further, the patterns of the adjoining heat generating layers 58 in the vertical direction may be displaced angularly about the central axis of the concentric circle or spiral form. Thereby, the probe base plate 40 may be heated uniformly at each location about the central axis of the concentric circle or the spiral form.

In the foregoing case, the patterns of the heat generating layers 58 adjoining in the thickness direction may be mutually displaced about the central axis of the concentric circle or the spiral form at an angle obtained by dividing 360° by the number of the heat generating layers 58.

To make the heating at each location of the probe base plate 40 by the heating element 62 more uniform, it is possible to set the width dimension or an arrangement pitch of each location of the heating element 62 to be of different value.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated. The described subject matter is not limited to the above embodiments but may be altered in various ways without departing from the spirit and scope presented here.

The invention claimed is:

1. A probe card, comprising:
    a probe base plate having a ceramic base plate and a plurality of conductive paths;
    a plurality of contacts arranged on one face of the probe base plate and electrically connected to said conductive paths;
    wherein said ceramic base plate includes:
    a plurality of first layers each having a heating element which generates heat by electric power and arranged at intervals in the thickness direction of said ceramic base plate;
    a second layer stacked between adjoining first layers and having said conductive paths; and
    a power supply path for supplying heating power to said heating element and
    wherein at least one of the first layers defines a through-hole which allows at least one conductive path to pass through the at least one first layers without contacting the heating element in the at least one first layers.

2. The probe card claimed in claim 1, wherein said heating element includes a pattern like a concentric circle or a spiral form.

3. The probe card claimed in claim 2, wherein said patterns of the first layers adjoining in the thickness direction are angularly displaced about the central axis of said concentric circle or the spiral.

4. The probe card claimed in claim 2, wherein the pattern of each first layer is divided into plural pattern sections.

5. The probe card claimed in claim 2, wherein the pattern of each first layer is divided into plural pattern sections about the central axis of said concentric circle or the spiral.

6. The probe card claimed in claim 2, wherein the pattern of each first layer is divided into plural pattern sections in the radial direction of said concentric circle or said spiral.

7. The probe card claimed in claim 2, wherein the patterns of said first layers adjoining in the thickness direction are displaced from each other about the central axis of said concentric circle or said spiral by an angle obtained by dividing 360° by the number of said first layers.

8. The probe card claimed in claim 1, wherein said power supply path penetrates said first and second layers in the thickness direction and is connected to said heating element without contacting said conductive path.

9. The probe card claimed in claim 1, wherein said ceramic base plate has a structure with said first and second layers laminated.

10. The probe card claimed in claim 1, wherein said ceramic base plate includes a plurality of said second layers situated in the thickness direction, and wherein said conductive paths of said second layers adjoining in the thickness direction are connected to each other without contacting said heating element.

11. The probe card claimed in claim 1, wherein said ceramic base plate has four of said first layers and a plurality of said second layers disposed between the first layers adjoining in the thickness direction.

12. A probe card, comprising:
a probe-base having a base plate and a plurality of conductive paths;
a plurality of contacts arranged on one face of the probe-base and electrically connected to said conductive paths;
wherein said base plate includes:
a plurality of first layers each having a respective electric heating element, the first layers stacked at intervals in the thickness direction of said base plate;
a second layer between adjacent ones of the first layers and having said conductive paths, the second layer and first layers forming a stack; and
a power supply path for supplying heating power to said respective heating element; and
wherein at least one of the first layers defines a through-hole which allows at least one conductive path to pass through the at least one first layers without contacting the heating element in the at least one first layers.

13. The probe card of claim 12, wherein at least one conductive path and the power supply path extends through at least one of the plurality of first layers and the second layer.

14. The probe card of claim 12, wherein the second layer is interposed between adjoining first layers such that a substantially planar second-layer-top and substantially planar second-layer-bottom are substantially contacted by respective first layers such that substantially no space remains between the respective first and second layers.

15. The probe card of claim 12, wherein the second layer is stacked between adjoining first layers such that the respective first layers are not contacting.

16. A probe card, comprising:
a probe-base having a base plate and a plurality of conductive paths;
a plurality of contacts arranged on one face of the probe-base and electrically connected to said conductive paths;
wherein said base plate includes:
a plurality of first layers each having a respective electric heating element, the first layers stacked at intervals in the thickness direction of said base plate;
a second layer between adjacent ones of the first layers and having said conductive paths, the second layer and first layers forming a stack; and
a power supply path for supplying heating power to said respective heating element; and
wherein the second layer is interposed between adjoining first layers such that a substantially planar second-layer-top and substantially planar second-layer-bottom are substantially contacted by respective first layers such that substantially no space remains between the respective first and second layers.

17. A probe card, comprising:
a probe base plate having a ceramic base plate and a plurality of conductive paths;
a plurality of contacts arranged on one face of the probe base plate and electrically connected to said conductive paths;
wherein said ceramic base plate includes:
a plurality of first layers each having a heating element which generates heat by electric power and arranged at intervals in the thickness direction of said ceramic base plate;
a second layer stacked between adjoining first layers and having said conductive paths; and
a power supply path for supplying heating power to said heating element; and
wherein the second layer is interposed between adjoining first layers such that a substantially planar second-layer-top and substantially planar second-layer-bottom are substantially contacted by respective first layers such that substantially no space remains between the respective first and second layers.

\* \* \* \* \*